US006251772B1

(12) United States Patent
Brown

(10) Patent No.: US 6,251,772 B1
(45) Date of Patent: Jun. 26, 2001

(54) DIELECTRIC ADHESION ENHANCEMENT IN DAMASCENE PROCESS FOR SEMICONDUCTORS

(75) Inventor: Dirk Brown, Santa Clara, CA (US)

(73) Assignee: Advanced Micro Devicees, Inc., Sunnyvale, CA (US)

( * ) Notice: Subject to any disclaimer, the term of this patent is extended or adjusted under 35 U.S.C. 154(b) by 0 days.

(21) Appl. No.: 09/301,887

(22) Filed: Apr. 29, 1999

(51) Int. Cl.[7] .................................................. H01L 21/4763
(52) U.S. Cl. ......................... 438/626; 438/625; 438/628
(58) Field of Search .................................... 438/626, 634, 438/622, 637, 633, 638, 639, 624, 625

(56) References Cited

U.S. PATENT DOCUMENTS 5,989,623 * 11/1999 Chen et al. .............................. 427/97
6,001,730 * 10/1999 Farkas et al. ......................... 438/627
6,010,962 * 1/2000 Liu et al. ............................. 438/687
6,048,796 * 4/2000 Wang et al. .......................... 438/692

* cited by examiner

*Primary Examiner*—David Nelms
*Assistant Examiner*—Dung A Le
(74) *Attorney, Agent, or Firm*—Mikio Ishimaru

(57) ABSTRACT

A method for manufacturing an integrated circuit using damascene processes is provided in which dielectric surfaces subject to chemical-mechanical polishing are roughened after polishing to increase the surface area to provide more surface for chemical and mechanical bonding of subsequent layers.

20 Claims, 2 Drawing Sheets

DIELECTRIC ADHESION ENHANCEMENT IN DAMASCENE PROCESS FOR SEMICONDUCTORS

CROSS-REFERENCE TO RELATED APPLICATION

The present application contains subject matter related to a concurrently filed U.S. patent application Ser. No. 09/302,036 filed Apr. 29, 1999 now U.S. Pat. No. 6,107,185 by Todd P. Lukanac entitled "Conductive Material Adhesion Enhancement in Damascene Process for Semiconductors".

TECHNICAL FIELD

The present invention relates generally to semiconductors and more specifically to a manufacturing method for dual damascene semiconductors.

BACKGROUND ART

In the process of manufacturing integrated circuits, after the individual devices such as the transistors have been fabricated in the silicon substrate, they must be connected together to perform the desired circuit functions. This connection process is generally called "metalization" and is performed using a number of different photolithographic and deposition techniques.

One metalization process, which is called the "damascene" technique, starts with the placement of a first channel dielectric layer, which is a silicon dioxide or other oxide layer, over the semiconductor devices. A first damascene step photoresist is then placed over the dielectric layer and is photolithographically processed to form the pattern of the first channels. An anisotropic etch, generally an oxide etch, is then used to etch out the channel dielectric layer to form the first channel openings. The damascene step photoresist is then stripped and a conductive material is deposited in the first channel openings.

Some conductive materials, such as copper, require preparatory steps before deposition. An optional adhesion material, such as tantalum or titanium, is deposited followed by a barrier material, such as tantalum nitride or titanium nitride. The combination of the adhesion and barrier material is collectively referred to as "barrier layer" herein. The barrier layer is used to prevent failure causing diffusion of the conductive material of the channels into the dielectric layer and the semiconductor devices. A seed layer is then deposited on the barrier layer to form a conductive material base, or "seed", for subsequent electro-deposition of the conductive material.

The conductive material deposited in the first channel openings and is then subjected to a chemical-mechanical polishing process which removes the materials above the first channel dielectric layer and above the first channel openings. With the chemical-mechanical polishing, the conductive material is "damascened" into the first channel dielectric layer to form the first conductive channels. This chemical-mechanical polishing process attempts to leave the first channel dielectric layer and the conductive material in the channel as smooth and as planar as possible for subsequent operations. This requires the use of a very fine abrasive in the process.

For multiple layers of channels, the "dual damascene" technique is used in which the channels and vias are formed at the same time. In one example, the via formation step of the dual damascene technique starts with the deposition of a thin dielectric etch stop layer, such as a silicon nitride, over the first channels and the first channel dielectric layer. Subsequently, a via dielectric layer is deposited on the etch stop layer. This is followed by deposition of a thin via dielectric etch stop layer, generally another nitride layer. Then a via step photoresist is used in a photolithographic process to designate round via areas over the first channels.

A stop layer etch, generally a nitride etch, is then used to etch out the round via areas in the via nitride. The via step photoresist is then removed, or stripped. A second channel dielectric layer is then deposited over the via dielectric stop layer and the exposed via dielectric layer. A second damascene step photoresist is placed over the second channel dielectric layer and is photolithographically processed to form the pattern of the second channels. An anisotropic etch is then used to etch the second channel dielectric layer and the via dielectric layer to form the second channel openings and the via areas down to the thin etch stop layer above the first channels. The damascene photoresist is then removed, and a stop layer etch process removes the via etch stop layer above the first channels in the via areas.

For conductive materials such as copper as previously described, a barrier layer is then deposited to coat the via openings and the second channel openings. Next, a seed layer is deposited on the barrier layer. This is followed by a deposition of the conductive material in the second channel openings and the via openings to simultaneously fill the second channel and the vias. A second chemical-mechanical polishing process defines the second channel and leaves the two vertically separated channels connected by a cylindrical via. Again, this chemical-mechanical polishing process attempts to leave the first channel dielectric layer and the conductive material in the channel as smooth and as planar as possible for subsequent operations.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

In the past, those skilled in the art tried to make the surfaces resulting from the chemical-mechanical polishing steps as smooth and as planar as possible to provide flat surfaces for subsequent layers and alignment for further photolithographic processing.

With smaller and smaller semiconductor geometries, adhesion of subsequent layers to dielectric materials in semiconductors has been found to be important for reliability. Both chemical and mechanical delamination are sources of semiconductor device failures. Thus, a method for enhancing the adhesion has become increasingly important.

DISCLOSURE OF THE INVENTION

The present invention provides a method for enhancing adhesion to dielectric materials by roughening the surface to increase the surface area for improved chemical and mechanical bonding. After deposition of the conductive material and chemical-mechanical polishing for planarization, the dielectric material is subject to a roughening which will increase the surface roughness by five over the final planarization finish.

The present invention provides a method for improving chemical-mechanical bonding between semiconductor layers by a final coarse polish after chemical-mechanical polishing.

The present invention provides a method for improving chemical-mechanical bonding between semiconductor layers by a high force scrub process after chemical-mechanical polishing.

The present invention provides a method for improving chemical-mechanical bonding between semiconductor layers by a chemical etching process after chemical-mechanical polishing.

The present invention provides a method for improving chemical-mechanical bonding between semiconductor layers by a plasma etching process after chemical-mechanical polishing.

The present invention provides a method for improving chemical-mechanical bonding between semiconductor layers by a high temperature blistering process after chemical-mechanical polishing.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
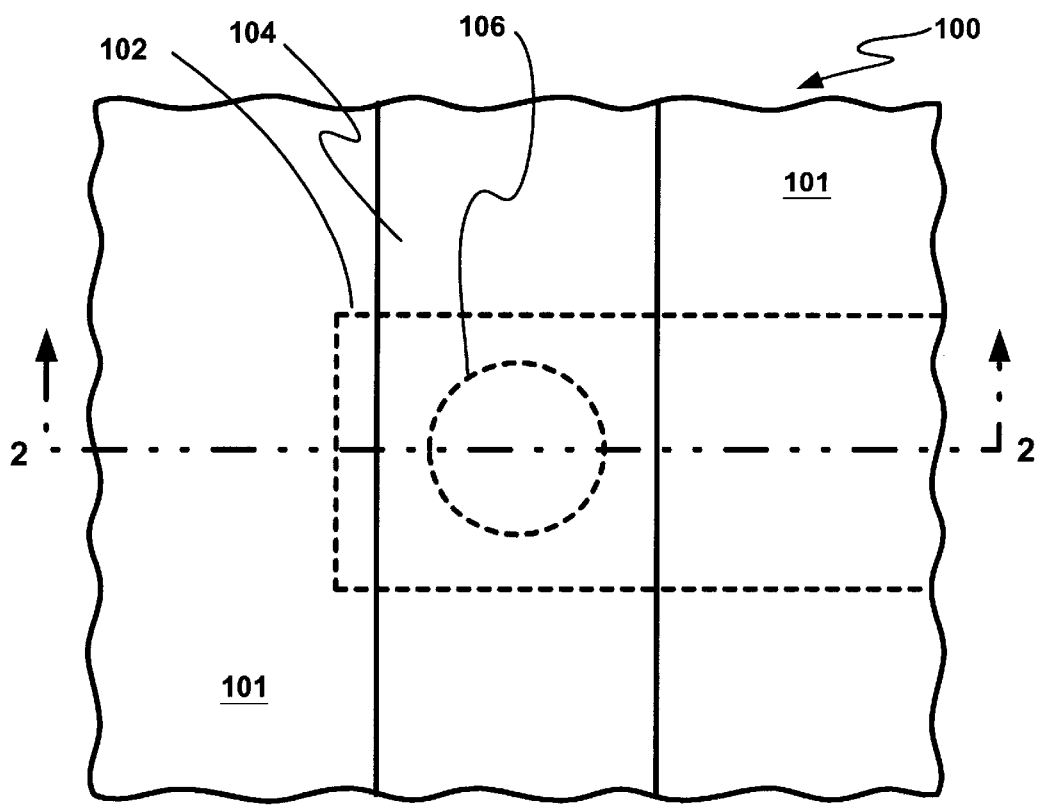
FIG. 1 (PRIOR ART) is a plan view of aligned channels of a prior art integrated circuit.

Referring now to FIG. 1 (PRIOR ART), therein is shown a plan view of a prior art pair of perpendicularly aligned semiconductor channels of a conductive material, such as copper, disposed on a production integrated circuit 100 in a dielectric layer 101. A first channel 102 is shown disposed below a second channel 104 which extends substantially perpendicular to the first channel 102 in the plan view. A cylindrical via 106 connects the first and second channels 102 and 104 and is a part of the second channel 104 by being deposited concurrently by a dual damascene technique.

Figure 2:
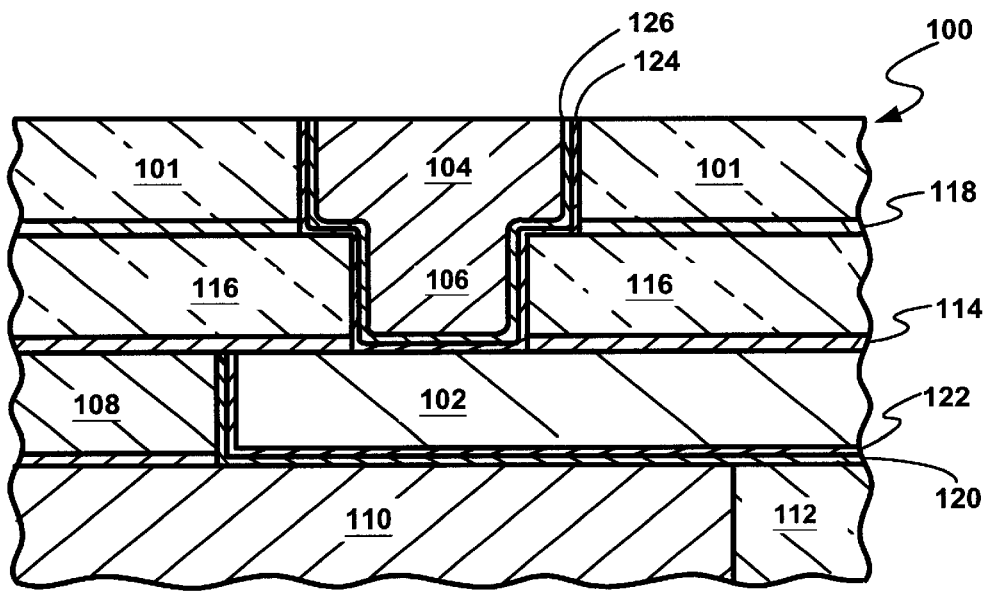
FIG. 2 (PRIOR ART) is a cross-section of FIG. 1 (PRIOR ART) along line 2—2.

Referring now to FIG. 2 (PRIOR ART), therein is shown a cross-section of FIG. 1 (PRIOR ART) along 2—2. The first channel 102 is disposed in the first channel dielectric layer 108 over a polysilicon gate 110 and a semiconductor device dielectric layer 112 of a semiconductor device (not shown). The first and second channels 102 and 104 are connected by the cylindrical via 106 and are in horizontal planes separated vertically by an etch stop layer 114, a via dielectric layer 116, and a thin via etch stop layer 118. Also shown disposed around the first channel 102 are a barrier layer 120 and seed layer 122, and around the second channel 104 and the cylindrical via 106 is a barrier layer 124 and seed layer 126. For simplicity, these layers are not shown in FIG. 1 (PRIOR ART).

For copper or copper alloy conductive materials, the barrier layers are made up of barrier materials such as tantalum, titanium, tungsten, their alloys, compounds thereof (especially their nitrides) and combinations thereof. The barrier materials are intended to prevent detrimental migration of copper into the dielectric materials. The copper seed layers are deposited on top of the barrier layers to provide a conductive layer for the subsequent electroplating of copper which makes up the channels.

After deposition of the conductive material which will fill the channels and cover the dielectric layers, the conductive material outside the channels must be removed. The removal is accomplished using a chemical-mechanical polishing process which abrades the conductive material from the surface of the semiconductor wafer (not shown) until it is left only in the channels.

It should be understood that each layer of dielectric material and conductive material are subject to the chemical-mechanical polishing process to a smoothness of approximately 100 A° before the deposition of the subsequent dielectric layers. Thus, the first channel dielectric layer 108 and the first channel 102, and the second channel dielectric layer 101 and second channel 104, are subject to the chemical-mechanical polishing process in preparation for the etch stop layer 114 and subsequent multi-layers of channels, respectively.

Figure 3:
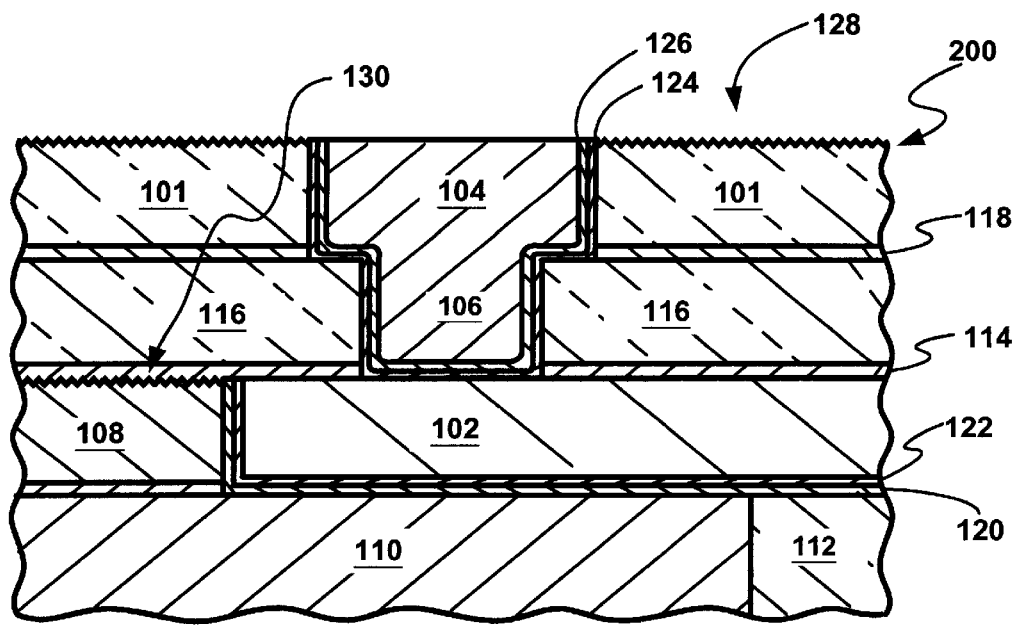
FIG. 3 is a cross-section similar to FIG. 2 (PRIOR ART) during an intermediate stage of processing for the integrated circuit of the present invention.

Referring now to FIG. 3, therein is shown a cross-section similar to FIG. 2 (PRIOR ART) of an integrated circuit 200. For ease of understanding, the same elements as shown in FIG. 2 (PRIOR ART) are numbered with the same numbers. The first channel 102 is shown disposed in a first channel dielectric layer 108 over the polysilicon gate 110 and the semiconductor device dielectric layer 112, which are portions of a semiconductor device (not shown). Disposed vertically above the first channel 102 are the etch stop layer 114, the via dielectric layer 116, the thin via etch stop layer 118, and the second channel dielectric layer 101. Again, the dielectric layers are generally of silicon dioxide, and the etch stop layers are generally of silicon nitride.

Also shown disposed around the first channel 102 are the barrier layer 120 and the seed layer 122. In the preferred embodiment, the barrier layers are made up of barrier materials such as tantalum, titanium, tungsten, their alloys, compounds thereof (especially nitrides), and combinations thereof. The channels are generally of copper, aluminum, polysilicon, gold, silver, alloys thereof, and combinations thereof.

Finally, a chemical-mechanical polishing step is used to remove all the material above the second channel dielectric layer 101 and to expose it for further processing.

In FIG. 3, the top surface 128 of the second channel dielectric layer 101 is shown roughened. The prior art teaches that it is necessary to maintain a surface finish of under 100 A° TIR (Total Indicator Reading) for 0.18 micron semiconductor geometries, in the present invention the surface roughness will exceed 500 A° TIR. As semiconductor devices get smaller and smaller, for a given semiconductor geometry, the surface finish will be approximately five times rougher than that taught by the prior art as being a desirable surface finish after chemical-mechanical polishing for a particular geometry. This will provide increased chemical and mechanical bonding for subsequent layers.

As would be obvious to those skilled in the art, the same roughening process would be used for the top surface 130 of the first channel dielectric layer 108 in a single damascene process.

Figure 4:
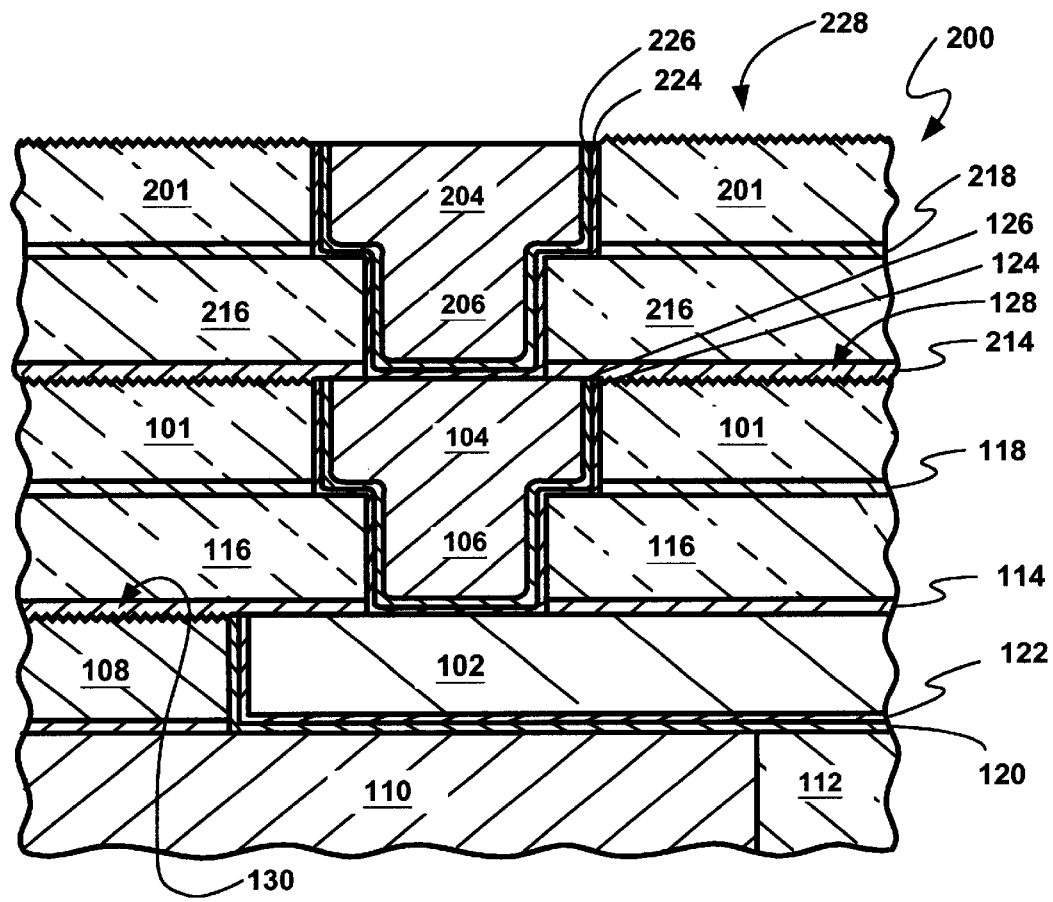
FIG. 4 is the integrated circuit of FIG. 3 after processing in accordance with the present invention.

Referring now to FIG. 4, therein is shown the integrated circuit 200 of FIG. 3 in a further stage of processing with a third channel 204 and a second via 206 added. Again, for ease of understanding, the same elements as shown in FIG. 3 are identified with the same numbers. The surface 128 has deposited thereon an etch stop layer 214 which adheres chemically and mechanically thereto since the surface area is greatly increased over the as-polished surface area.

On top of the etch stop layer 214 is a second via dielectric layer 216 which contains the second via 206. Deposited on top of the second via dielectric layer 216 is an etch stop layer 218 and a third channel dielectric layer 201 which contains the third channel 204. The third channel 204 and via 206 are embedded in barrier layer and seed layers 224 and 226, respectively. The third channel dielectric layer 201 has its surface 228 roughened after normal chemical-mechanical polishing for further processing as previously explained.

In production, a conventional first damascene process is used to deposit the first channel 102 in the first channel dielectric layer 108 above portions of the semiconductor device 110 and 112 on a production integrated circuit 200. The damascene process is a photolithographic process which uses a mask to define a first channel opening in the first channel dielectric layer 108. The first channel opening is then filled with the barrier layer 120 and the seed layer 122 which line the opening. A first conductive material, such as copper or a copper alloy, is deposited using conventional metal deposition techniques, such as physical vapor deposition, chemical vapor deposition, or a combination thereof, although electroplating is preferred, to form the first channel 102. The first channel 102 and the first channel dielectric 108 are subject to chemical-mechanical polishing. The surface 130 of the first channel dielectric layer 108 is then subject to the roughening process.

The etch stop layer 114, the via dielectric layer 116, and the via etch stop layer 118 would be successively deposited on top of the first channel 102 and the first channel dielectric layer 108 using conventional deposition techniques.

By using the via photoresist and the via photolithographic process followed by nitride etching of the via etch stop layer 118, the basis for the cylindrical via 106 is formed. There is then a subsequent deposition of the second channel dielectric layer 101. The second damascene process uses a further mask to define the second channel opening in the second channel dielectric layer 101. Using an anisotropic dielectric etch, the second damascene process also forms the cylindrical via 106 down to the etch stop layer 114. The anisotropic dielectric etch etches faster in the vertical direction of FIG. 3 than in the horizontal direction. The nitride etch of the etch stop layer 114 then exposes a portion of the first channel 102.

Next, the barrier layer 124 and the seed layer 126 are deposited to line the second channel opening by a process such as physical-vapor deposition or chemical-vapor deposition. The conductive material, generally copper or a copper alloy, is deposited by using the seed layer 126 as an electrode for electroplating copper ions from a plating bath. After the second channel opening is filled, a chemical-mechanical polishing process is used to polish the conductive material, the seed layer 126, and the barrier layer 124 down to the surface of the second channel dielectric layer 101. This damascenes the conductive material into the second channel dielectric layer 101 to form the second channel 104. It also leaves a polished surface finish on both the second channel dielectric 101 and the second channel 104.

After chemical-mechanical polishing, the surface 128 of the second channel dielectric layer 101 is roughened by a factor of approximately five. This preferably can be performed by using a final coarse polish as the final step of the chemical-mechanical polishing process. It can also be accomplished by a high force scrub of the surface 128 after the chemical-mechanical mechanical polishing process. Or, it can be performed by an etching step which could include chemical or plasma etching to increase the surface area of the surface 128. As another alternative, a high temperature could be used to blister the surface 128, for example by the application of laser energy. All of these processes would increase the surface area and improve the chemical and mechanical bonding characteristics of the surface 128.

After the surface 128 is roughened, the second damascene process is repeated to lay down the third channel 204 and the second via 206. For subsequent channels and vias, the appropriate surfaces, such as the surface 228, will undergo the same roughening process in order to achieve the same enhanced chemical and mechanical bonding of the dielectric layers.

While the best mode utilizes copper as the conductive material, it should be understood that the present invention is applicable to other conductive materials such as aluminum, silver, gold, alloys thereof, compounds thereof, and combinations thereof. Similarly, the barrier layer can be of tantalum, titanium, tungsten, alloys thereof, compounds thereof (especially nitrides), and combinations thereof.

The preferred embodiment of the present invention is directed to using a dual damascene technique. However, it also will be recognized that other techniques of forming interconnect, such as the single damascene technique, or other traditional techniques of forming low resistance contacts or plugs which involve filling an opening with conductive materials such as tungsten or aluminum may be used to practice the present invention.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing an integrated circuit, comprising the steps of:

providing a semiconductor device with a first dielectric layer formed thereon;

forming a first opening in said first dielectric layer, said first opening exposing said semiconductor device;

depositing a conductive material over said first dielectric layer and filling said first opening;

polishing said conductive material outside of said first opening to expose said first dielectric layer;

roughening said exposed first dielectric layer; and forming a second dielectric layer over said first dielectric layer.

2. The method as claimed in claim 1 wherein said step of: roughening said first dielectric layer is performed by a final coarse chemical-mechanical polishing process.

3. The method as claimed in claim 1 wherein said step of roughening said first dielectric layer is performed by a high force scrub process.

4. The method as claimed in claim 1 wherein said step of roughening said first dielectric layer is performed by a chemical etching process.

5. The method as claimed in claim 1 wherein said step of roughening said first dielectric layer is performed by a plasma etching process.

6. The method as claimed in claim 1 wherein said step of roughening said first dielectric layer is performed by a high temperature blistering process.

7. The method as claimed in claim 1 including a step of forming a barrier layer in said first opening and wherein said step of forming said barrier layer uses a material selected from a group consisting of tantalum, titanium, tungsten, alloys thereof, and combinations thereof.

8. The method as claimed in claim 1 including a step of forming a seed layer in said first opening and wherein said step of forming said seed layer uses a material selected from a group consisting of copper, aluminum, silver, gold, alloys thereof, and combinations thereof.

9. The method as claimed in claim 1 wherein said step of filling said openings with conductive materials uses a material selected from a group consisting of copper, aluminum, silver, gold, alloys thereof, and combinations thereof.

10. The method as claimed in claim 1 wherein said steps of forming said first and second dielectric layers use a material selected from the group consisting of silicon dioxide and silicon nitride.

11. A method of manufacturing an integrated circuit containing semiconductor devices, comprising the steps of:

forming a first dielectric layer on the semiconductor devices;

forming a first opening in said first dielectric layer, said first opening exposing said semiconductor devices;

forming a first barrier layer over said first dielectric layer and in said first opening in contact with said semiconductor device;

forming a first seed layer over said first barrier layer and in said first opening;

depositing a first conductive material over said first seed layer and filling said first opening;

polishing said first conductive material, said first seed layer, and said first barrier layer outside of said first opening to form a first channel and expose said first dielectric layer;

roughening said exposed first dielectric layer;

forming an etch stop dielectric layer over said first dielectric layer;

forming a via dielectric layer over said etch stop dielectric layer;

forming a second channel dielectric layer over said via dielectric layer forming a second channel opening in said second channel dielectric layer and in said via dielectric layer forming a via opening in said etch stop dielectric layer to expose said first channel;

forming a second barrier layer over said conductive material and said dielectric layers;

forming a second seed layer over said second barrier layer;

filling said second opening with a second conductive material over said second seed layer to form said via opening and said second channel opening; and polishing said second seed layer, said second barrier layer, and said second conductive material, outside said second opening to form said second channel and expose said second dielectric layer.

12. The method as claimed in claim 11 wherein the step of roughening said first dielectric layer is performed by a final coarse chemical-mechanical polishing process to leave a surface finish approximately five times rougher than said step of polishing.

13. The method as claimed in claim 11 wherein the step of roughening said first dielectric layer is performed by a final high force scrub process to leave a surface finish approximately five times rougher than said first step of polishing.

14. The method as claimed in claim 11 wherein the step of roughening said first dielectric layer is performed by a final chemical etching process to leave a surface finish approximately five times rougher than said first step of polishing.

15. The method as claimed in claim 11 wherein the step of roughening said first dielectric layer is performed by a final plasma etching process to leave a surface finish approximately five times rougher than said first step of polishing.

16. The method as claimed in claim 11 wherein the step of roughening said first dielectric layer is performed by high temperature blistering process to leave a surface finish approximately five times rougher than said first step of polishing.

17. The method as claimed in claim 11 wherein the steps of forming said barrier layers use materials selected from a group consisting of tantalum, titanium, tungsten, alloys thereof, and combinations thereof.

18. The method as claimed in claim 11 wherein the steps of forming said seed layers use materials selected from a group consisting of copper, aluminum, silver, gold, alloys thereof, and combinations thereof.

19. The method as claimed in claim 11 wherein the step of filling said openings with conductive materials uses a material selected from a group consisting of copper, aluminum, silver, gold, alloys thereof, and combinations thereof.

20. The method as claimed in claim 11 wherein said steps of forming said dielectric layers use a material selected from the group consisting of silicon dioxide and silicon nitride.

* * * * *